(12) United States Patent
Wiegert

(10) Patent No.: US 8,575,929 B1
(45) Date of Patent: Nov. 5, 2013

(54) MAGNETIC ANOMALY SURVEILLANCE SYSTEM USING SPHERICAL TRILATERATION

(75) Inventor: Roy F. Wiegert, Panama City, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 337 days.

(21) Appl. No.: 13/135,327

(22) Filed: Jun. 20, 2011

(51) Int. Cl.
*G01R 33/02* (2006.01)
(52) U.S. Cl.
USPC ............ 324/245; 324/247; 324/244; 702/152
(58) Field of Classification Search
USPC ......... 324/244, 260, 246–247, 210–213, 326, 324/345
See application file for complete search history.

(56) References Cited

U.S. PATENT DOCUMENTS

| | | | | |
|---|---|---|---|---|
| 7,342,399 | B1 * | 3/2008 | Wiegert | 324/326 |
| 7,603,251 | B1 * | 10/2009 | Wiegert et al. | 702/152 |
| 7,688,072 | B1 * | 3/2010 | Wiegert et al. | 324/326 |
| 7,932,718 | B1 * | 4/2011 | Wiegert | 324/247 |

* cited by examiner

*Primary Examiner* — Arleen M Vazquez
*Assistant Examiner* — Son Le
(74) *Attorney, Agent, or Firm* — James T. Shepherd

(57) ABSTRACT

A magnetic anomaly surveillance system includes triaxial magnetometer (TM) sensors arranged at known locations in an array. A processor coupled to the TM sensors generates a scalar magnitude of a magnetic anomaly field measured at each of the TM sensors. The scalar magnitude is indicative of a spherical radius centered at the known location associated with a corresponding one of the TM sensors. The processor also generates a comparison between each scalar magnitude and a threshold value. The processor then determines at least one magnetic anomaly location in the coordinate system via a spherical trilateration process that uses each spherical radius and each scalar magnitude associated with selected ones of the TM sensors for which the threshold value is exceeded. One or more output devices coupled to the processor output data indicative of the one or more magnetic anomaly locations.

24 Claims, 7 Drawing Sheets

MAGNETIC ANOMALY SURVEILLANCE SYSTEM USING SPHERICAL TRILATERATION

ORIGIN OF THE INVENTION

The invention described herein was made in the performance of official duties by an employee of the Department of the Navy and may be manufactured, used, licensed by or for the Government for any governmental purpose without payment of any royalties thereon.

FIELD OF THE INVENTION

The invention relates generally to magnetic sensing systems, and more particularly to a magnetic anomaly surveillance system that includes a spatial network of triaxial magnetometers whose outputs are utilized in a magnetic scalar-based spherical trilateration processing scheme to detect, localize, classify, and track magnetic objects moving through a region of interest.

BACKGROUND OF THE INVENTION

There are many potential military and commercial applications for improved (e.g., faster-responding, longer-range, more accurate, and economical) passive magnetic anomaly sensing-based surveillance systems that can detect, localize, classify, and track magnetic objects (e.g., as large as naval vessels, motor vehicles, etc., or as small as person-borne weapons, etc.) moving through a region of interest that can span over hundreds or thousands of square meters. The word "passive" indicates that the magnetic sensing system does not produce magnetic anomaly fields but only detects (and processes) the magnetic anomaly field that emanates from an object's inherent magnetic dipole signature. The magnetic dipole signatures stem from ferrous materials that are contained in the physical structure of an object.

In general, passive magnetic anomaly sensing-based systems for magnetic localization and classification of magnetic objects measure and analyze the magnetic induction fields that emanate from the objects. Magnetic localization is based on the fact that, at sensor-to-object distances greater than about twice the largest dimension of an object, the fields can be mathematically described by the magnetic dipole equation that relates the object's vector magnetic field components to the vector components of the object's position in space and its vector magnetic dipole moment. The object's magnetic dipole vector depends on the size, shape, orientation and magnetic permeability of the ferrous materials (i.e., iron, most steels, nickel, etc.) contained within the object. Thus, measurements of an object's magnetic dipole moment provide "magnetic signature" data that can be used to magnetically classify the object.

The use of passive magnetic sensors for accurate localization of magnetic objects generally involves an application of the magnetostatic dipole equation to magnetic field data measured by the sensors. The dipole equation relates three Cartesian (XYZ) components of an object's magnetic anomaly field at a given point in space to the three XYZ components of the point (relative to the object position) and the three XYZ components of the object's magnetic dipole vector. Therefore, in accordance with the magnetostatic dipole equation, the process of magnetic localization and classification of a magnetically polarized object requires measurement of magnetic anomaly field components to determine six unknown quantities; namely, three XYZ components of object position and three XYZ components of the object's magnetic signature vector. That is, the localization/classification process requires the measurement of at least six independent field quantities in order to determine the aforementioned six unknown object parameters.

A system for accurate "detection, localization, classification, and tracking" (DLCT) of moving magnetic objects should take into account the fact that a ferrous object's dipole moment signature typically will change as the object moves/rotates through the Earth's magnetic field. Thus, for moving objects, the DLCT process is complicated by the fact that a ferrous object's magnetic signatures will be continuously changing in magnitude and direction as the object's orientation in the Earth's magnetic field changes. (If the moving object is a permanent magnet only the direction of its magnetic dipole signature will change; however, the magnitude of its magnetic signature will remain constant even while the object rotates in the Earth's field.)

Conventional prior art magnetic sensor systems for stand-off DLCT of magnetic objects typically use individual field and/or gradient component measurements and least squares methods or matrix inversion processes to simultaneously solve the magnetic dipole equation (and/or its gradients) for an object's vector position in space and magnetic dipole moment. However, because of the complexities of the dipole equation, the symmetries (i.e., lack of uniqueness) of magnetic anomaly field components, and the complexities introduced by motion-dependent changes in magnetic signature parameters, the conventional approach can result in multiple incorrect solutions (often denoted as "ghosts") for an object's location. The correct solution can be determined by analyzing a time series of magnetic field data. However, this process can limit the speed of a conventional magnetic sensor's effective DLCT response. Also, the conventional approach's accuracy can be severely degraded if the object's motion results in its magnetic dipole signature changing during the field measurement/data collection process.

In order to overcome the limitations of conventional prior art magnetic sensing systems a unique magnetic scalar triangulation and ranging (i.e., magnetic STAR or MagSTAR) technology has been developed for high speed DLC of magnetic objects. The MagSTAR approach uses gradient tensor magnitudes (aka "contractions") and/or anomaly field magnitudes to perform unambiguous "ghost-free" localization of magnetic objects. Each data sample collected by a MagSTAR sensor contains at least six independent channels of field or gradient info; and so the MagSTAR process allows complete point-by-point determination of object location and magnetic dipole signature. Therefore, the MagSTAR approach has a great advantage over prior art in that it can locate and track a magnetic object even while the object's magnetic signature is changing. In particular, means and methods for applying the MagSTAR approach for high-speed precision localization and tracking of moving magnetic objects are described in U.S. Pat. No. 7,342,399 (the '399 patent hereinafter) and patent application Ser. No. 12/383,083 (the '083 application hereinafter), filed Mar. 12, 2009. The '399 patent and the '083 application disclose unique magnetic sensing-based systems and methods that process data from rigid arrays of four or more vector triaxial magnetometers (TM) in unique, ghost-free MagSTAR algorithms for precision, high-speed localization, tracking and classification of magnetic objects. The '399 patent and the '083 application have unique advantages in that they can provide very accurate tracking of magnetic objects even while their magnetic dipole signatures are changing due to their motion in the earth's magnetic field.

However, the relatively short range, complexity, expense, and power requirements of the multi-TM, gradient-sensing embodiments of the '399 patent may not be optimal for many large-region surveillance applications. The means and methods for DLCT of moving objects taught in the '083 application overcome many of the limitations of the '399 patent by using less complex embodiments to process relatively longer-range magnetic anomaly field magnitudes. Nevertheless, the multi-TM embodiments of the '083 application may still be more complex and, therefore, more expensive than desirable for a magnetic surveillance system that must be able to observe a large area.

SUMMARY OF THE INVENTION

Accordingly, it is an object of the present invention to provide a magnetic anomaly surveillance system.

Another object of the present invention is to provide a magnetic anomaly surveillance system that uses passive magnetic sensing technology.

Still another object of the present invention is to provide a magnetic anomaly surveillance system that can be used to observe a wide variety of sizes of areas or volumes.

Other objects and advantages of the present invention will become more obvious hereinafter in the specification and drawings.

In accordance with the present invention, a magnetic anomaly surveillance system includes a plurality of triaxial magnetometer (TM) sensors with each of said TM sensors having X,Y,Z magnetic sensing axes. The TM sensors are arranged in an array with respective ones of their X,Y,Z magnetic sensing axes being mutually parallel to one another in the array. Each TM sensor is at a known location in a coordinate system. A processor coupled to the TM sensors generates a scalar magnitude of a magnetic anomaly field measured at each of the TM sensors. The scalar magnitude is indicative of a spherical radius centered at the known location associated with a corresponding one of the TM sensors. The processor also generates a comparison between each scalar magnitude and a threshold value. The processor then determines at least one magnetic anomaly location in the coordinate system via a spherical trilateration process that uses each spherical radius and each scalar magnitude associated with selected ones of the TM sensors for which the threshold value is exceeded. One or more output devices coupled to the processor output data indicative of the one or more magnetic anomaly locations.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Prior to describing the present invention's novel magnetic anomaly surveillance system using spherical trilateration, some technical background related to magnetic anomaly sensing will be provided below. In general, the design and operation of magnetic sensing systems for "detection, localization and classification" (DLC) of magnetically polarized objects use the following phenomena:

1. The vector magnetic fields (B) that emanate from a magnetic object's magnetic moment (i.e., magnetic signature (M)) produce relatively small, short-range "magnetic anomalies" within the Earth's magnetic background field ($B_E$). In principle, magnetic anomaly sensing systems can measure and process B-field data to detect the presence of a magnetic object, locate its position in space, and classify the object in terms of its magnetic dipole moment signature M.

2. The relatively large, and locally nearly uniform (over short distances of hundreds of meters or less) magnetic induction field of Earth ($B_E$) permeates all space around the planetary surface. The $B_E$ field may induce much of an object's net magnetic signature M that is the source of an object's magnetic anomaly field B. However, the earth's magnetic field also complicates the process of DLC of magnetic objects.

Figure 1:
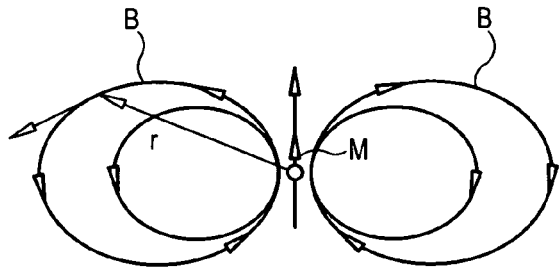
FIG. 1 is a qualitative sketch illustrating magnetic lines of force of a vector magnetic dipole field.

The present invention uses the well-known dipole equation $$B(r,M) = (\mu/4\pi)[3(M \cdot r)r/r^5 - M/r^3] \tag{1a}$$

where the units of B are tesla (T), "r" is the location vector of the B-field measurement point (relative to the object) in meters (m), "M" its magnetic dipole moment in amperes (A) meters squared or $Am^2$, $\mu$ is the magnetic permeability of the surrounding media and is approximately equal to $4\pi \times 10^{-7}$ Tm/A, and $\pi = 3.14159$. FIG. 1 is a qualitative sketch showing the relation of the vector field "lines of force" of B to r and M. In order to perform point-by-point localization and classification of a magnetic dipole type object, a magnetic sensor system (or "magnetometer") must collect sufficient B-field data to determine six unknowns; namely, three vector components of object location r and three vector components of magnetic dipole moment (or "signature") M. The components of M can be used to magnetically classify the object.

In a Cartesian coordinate system with unit vectors i,j,k along the XYZ directions, the three components of B can be written in terms of the six independent scalar components of r and M ($r_x$, $r_y$, $r_z$ and $M_x$, $M_y$, $M_z$) as:

$$B_X = (\mu/4\pi)[(3r_X^2 - r^2)M_X + 3r_X r_Y M_Y + 3r_X r_Z M_Z]r^{-5}$$

$$B_Y = (\mu/4\pi)[3r_X r_Y M_X + (3r_Y^2 - r^2)M_Y + 3r_Y r_Z M_Z]r^{-5}$$

$$B_Z = (\mu/4\pi)[3r_X r_Z M_X + 3r_Y r_Z M_Y + (3r_Z^2 - r^2)M_Z]r^{-5} \quad (1b)$$

Note that these equations are nonlinear with regard to components of r and linear with regard to components of M. The scalar magnitudes B=|B|, r=|r| and M=|M| are given by:

$$B = [(B_X)^2 + (B_Y)^2 + (B_Z)^2]^{0.5}$$

$$r = [(r_X)^2 + (r_Y)^2 + (r_Z)^2]^{0.5}$$

$$M = [(M_X)^2 + (M_Y)^2 + (M_Z)^2]^{0.5}$$

The scalar magnitudes of magnetic anomaly fields (and gradient tensors) can be expressed in the form of a central potential-type scalar field. Specifically, the magnitude B can be expressed as:

$$B = (\mu/4\pi)k_B M r^{-3} \quad (2)$$

Figure 2A:
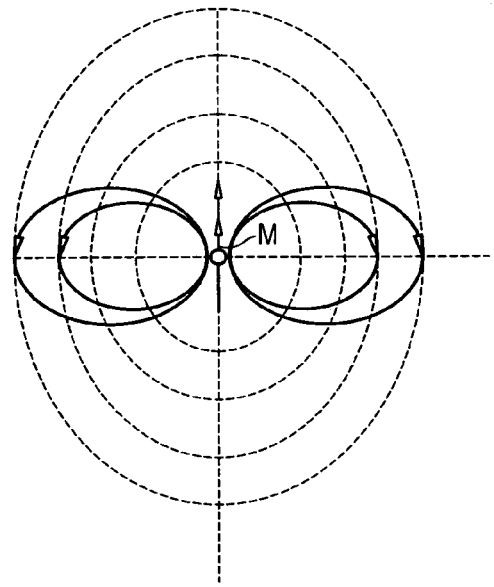
FIG. 2A is a qualitative two-dimensional graphic view of a magnetic object's magnetic dipole field and contours of constant magnetic anomaly field magnitudes associated with the magnetic dipole field.
Figure 2B:
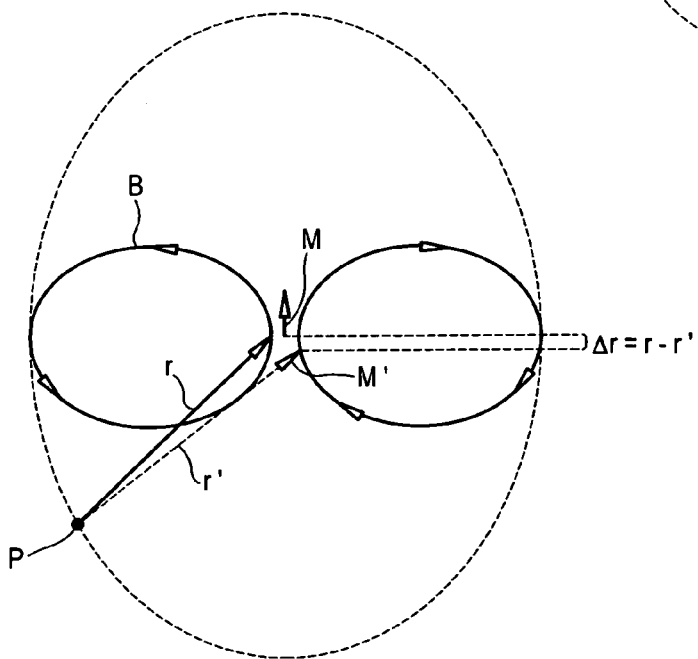
FIG. 2B is a qualitative two-dimensional graphic view of a single contour of constant magnetic anomaly field magnitude illustrating the ranging and magnetic signature measurement errors introduced by the aspherical nature of the constant magnetic anomaly field magnitude contour.

The above set of equations do not provide sufficient information to directly determine the six unknown quantities $r_X$, $r_Y$, $r_Z$ and $M_X$, $M_Y$, $M_Z$. However, the present invention's embodiments take advantage of the following features of the magnitude B of the magnetic anomaly field:

1. The scalar magnitude B is a rotationally invariant and robust quantity.
2. The B-field can be mathematically expressed in a form that is analogous to a central potential type scalar field. Specifically, the magnitude $B = (\mu/4\pi)k_B M r^{-3}$ includes $k_B$ that is a dimensionless "asphericity parameter" or a number ($1 \le k_B \le 2$) that characterizes the B-field's departure from perfect spherical symmetry.
3. For a magnetic dipole object, contours of constant B (indicated by the dashed lines in FIG. 2A) form a family of concentric prolate quasi-spheroidal "equipotential-type" surfaces that are centered on the dipole. For a given constant B, the ratio of the spheroid's major (vertical) axis to its minor (horizontal) axis is equal to the cube root of the ratio of the major axis asphericity parameter to the minor axis asphericity parameter, i.e., equal to $(2/1)^{1/3} = 1.26$ to 1 (or nearly unity). Thus, in a first approximation, the surfaces of constant B-magnitude can be mathematically expressed using equations for spheres of constant radius.

As will be discussed below, these features of B are analogous to those of the "gradient contraction field" ($C_T$) disclosed in the '399 patent with one major difference. Namely, $B \propto 1/r^3$ while $C_T \propto 1/r^4$. Therefore, the present invention's use of magnetic anomaly magnitudes as primary DLC parameters instead of the gradient contraction type parameters used by the prior art STAR technologies increases the range of STAR technology-based object DLC and/or tracking.

As mentioned above, the Earth's field $B_E$ complicates the process of measuring the components of B due to a magnetic anomaly or object. Since an object's B field components are convolved with the Earth's main field $B_E$, a magnetic sensing system actually performs measurements of a total field ($B_T$) that is given by:

$$B_T = (B_E + B) = (B_{EX} + B_X)i + (B_{EY} + B_Y)j + (B_{EZ} + B_Z)k \quad (3)$$

The Earth's field $B_E$ makes it difficult to effectively measure/discriminate $B_X$, $B_Y$ and $B_Z$ because:

1. At distances of a few meters from a typical object, its B-field magnitude is relatively very small (i.e., on the order of $10^{-9}$ tesla or 1 nano-tesla (nT)) or less. Thus, measurement of B-fields requires highly sensitive field-sensing instruments.
2. $B_E$ has a magnitude $B_E$ that varies from about 30,000 nT at the Earth's equator to about 60,000 nT at the Earth's poles. Thus $B_E$ is many orders of magnitude larger than an object's B, and can interfere with high sensitivity measurements of B unless the sensing system has a very high "dynamic range" (i.e., well over 100 dB) and/or provides an embodiment with means and methods to greatly reduce the effects of $B_E$.
3. Due to solar wind and other effects, the XYZ components of $B_E$ may unpredictably change by tens or hundreds of nano-tesla over time periods of minutes. These non-object-related "temporal" effects must somehow be compensated for, or they will greatly interfere with measurement of the XYZ components of B.

In order to overcome these difficulties, the present invention can include means and methods that enable accurate measurement and discrimination of very small XYZ components of B that are convolved with the relatively very large and time-dependent Earth field $B_E$. Although the invention's primary DLC modality uses B-field magnitudes, the invention can also use magnetic gradient-derived quantities to i) reduce the effects of temporal variations in the components of $B_E$, and ii) provide a complementary DLC modality.

It is generally known in the art of magnetic sensing that the spatial rate of change of $B_E$ with distance, i.e., the gradient of $B_E$ or $\nabla B_E$, is relatively very small and does not change appreciably with time. Typically, $|\nabla B_E|$ is approximately 0.02 nT/meter. Therefore, the temporal effects of $B_E$ can be greatly reduced by using sensor system embodiments that measure magnetic gradients.

The gradient of the vector field ($G = \nabla B$) is a second-rank tensor whose matrix elements are given by:

$$(\nabla B)_{ij} \equiv G_{ij} \equiv \partial B_i / \partial r_j \quad (4)$$

$$= -3(\mu/4\pi)[M \cdot r(5r_i r_j - r^2 \delta_{ij}) - r^2(r_i M_j + r_j M_i)]r^{-7}$$

The "i" and "j" sub indices represent XYZ components and $\delta_{ij}$ is the "Kronecker delta function". In terms of actual measurements, gradient data represents differential field values obtained by (for example) subtracting the B field at point (J) from the field at point (I) and dividing the differential field by the distance between I and J. Thus, in terms of sensor system measurements, the $\partial B_i / \partial r_j$ quantities are given by the approximation:

$$\partial B_i / \partial r_j \approx \Delta B_i / \Delta r_j = \Delta B_x / \Delta x, \Delta B_x / \Delta x, \Delta B_x / \Delta y, \Delta B_x / \Delta z, \Delta B_y / \Delta x, \Delta B_y / \Delta y, \Delta B_y / \Delta z, \Delta B_z / \Delta x, \Delta B_z / \Delta y, \Delta B_z / \Delta z.$$

As indicated above, the effective use of a passive magnetic anomaly sensing system for real-time tracking of the magnetic anomaly field (B) of a moving magnetic object requires simultaneous determination of six unknown quantities, i.e., three components of an object's vector position (r) and three components of the object's magnetic dipole moment (N). For the preferred surveillance system embodiments of the present invention, the magnetic anomaly magnitudes that are measured at different sensor nodes "I" (i.e., the $B_I$) constitute primary object-proximity-sensing parameters while differential field quantities (and/or gradients) constitute adjunct parameters that can be used to i) compensate for non-magnetic-anomaly-related changes in the background field $B_E$, and ii) provide a complementary object-localization modality for surveillance involving multiple targets and/or magnetic clutter.

In general, the present invention's surveillance system includes some or all of the following:

(1) A magnetic anomaly sensing system based on a network of Triaxial Magnetometers (TM). A simple embodiment of the invention comprises a stationary network of individual TMs (also referred to herein as nodes or sensing nodes) that are distributed with internodal separations ranging from centimeters to tens of meters over a surveillance region. The appropriate separation distances between individual TMs will depend on the following: i) the TM's magnetic field sensitivities, ii) the likely magnetic signatures of the objects of interest, iii) the likelihood that the invention will be required to localize and track multiple objects simultaneously. Each I-th TM measures XYZ components of a total vector magnetic field ($B_{TI}$) that is the vector sum of the object's magnetic anomaly field ($B_I$) and a nearly static background field ($B_{EI}$) comprised by the Earth's field and any static anomalies that may be present. Thus, $B_{TI}=B_I+B_{EI}$.

(2) A very accurate and very wide-dynamic-range data acquisition system that is capable of resolving the sub-nano Tesla (nT) XYZ components of $B_I$-field that are convolved with the 50,000 nT $B_E$ field. For some applications, the dynamic range requirements can be reduced by using a high-pass filter to remove the nearly static $B_E$-field. However, preferred embodiments of the invention could use wide dynamic range digitizer systems to convert the TMs' analog $B_{TI}$ signals to digital data.

(3) Signal processing functions that provide for accurate discrimination of the XYZ components of $B_I$ field. These functions, which can be performed by a personal computer, embedded processor, etc., can include the following (some functions could be eliminated for applications that are cost-sensitive, require less precision, etc., as noted below):

a) Sensor system baseline calibration with no object present: This step measures and stores XYZ components of magnetic background field $B_{EI}$ at all TM sensor locations (i.e., network nodes), determines and removes background gradients and channel imbalances between I-th and J-th TM sensors in the network, and continually updates, object-free $B_{E,I}$ data to compensate for possible sensor system baseline changes due to geomagnetics, sensor system drift, etc.

b) Sensor system operation for surveillance mode: This involves near-simultaneous (i.e., to a milli-second or better depending on object velocities) measurement of XYZ components of the $B_{T,I}$ field at all network nodes. For most embodiments of the present invention, this will also include determination of internodal field differentials ($\Delta B_{T,I-J}$) and/or gradients between the TM sensors at points I and J of the network. For example, $B_{T1,X}$, $B_{T1,Y}$, $B_{T1,Z}$ are the three XYZ components of $B_T$ that are measured by a TM at network node "I" and $\Delta B_X/\Delta S_X = (B_{TI,X}-B_{TJ,X})/\Delta S_X$, is a gradient in the X-direction measured between the TM at network node I and the TM at network node J where $\Delta S_X$ is the X-direction separation distance between the TMs.

c) Comparison of $|\Delta B_T|=|B_{TI}-B_{EI}|$ and (in most cases) $|\Delta B_{T,I-J}|=|B_{TI}-B_{TJ}|$ to their respective detection thresholds: These comparisons will be used to determine if an object has been detected, if there is sufficient data to locate/track the object using the invention's spherical trilateration process, if multiple objects are present or, if the background field $B_{EI}$ comprised by the Earth's field and any nearby static anomaly field sources has changed. The invention's signal processing/object-discrimination method imposes the condition that for object detection to be verified, at least one $|B_I|=B_{TI}-B_{EI}|$ and $|\Delta B_{T,I-J}|=|B_{TI}-B_{TJ}|$ must be greater than their respective detection threshold values. Note that the minimum number of nodes that must satisfy the threshold requirement will vary with the application and dimensional nature of the array of sensing nodes as will be explained further below.

d) Determination of XYZ components of magnetic anomaly field ($B_I=B_{TI}-B_{EI}$) and calculation of magnitudes $B_I=[(B_{I,X})^2+(B_{I,Y})^2(B_{I,Z})^2]^{0.5}$ at each "I-th" measurement point of the array.

e) Initial screening for multiple objects by comparing scalar magnitudes $B_I$ from all network nodes.

f) Expression of the magnitudes $B_I$ in the form of a central potential-type function that that relates the $B_I$ to an object's scalar range ($r_I$) relative to a point I and the object's magnetic dipole moment (M). Specifically, $B_I=(\mu/4\pi) k_{B,I} M r_I^{-3}$ where $\mu$ is magnetic permeability ($\approx 4\pi \times 10^{-7}$ tesla×meter/amp (Tm/A) for non-magnetic media), it is 3.14, and $k_{B,I}$ is an "asphericity parameter" ($1 \le k_{B,I} \le 2$) that characterizes the $B_I$ field's departure from spherical symmetry. The $k_{B,I}$ parameter relates to "asphericity errors" that can cause relatively small errors in object localization processes that are based on the above-described scalar potential function as described in the afore-cited '399 patent and the '083 application.

(4) Determination of an unambiguous object location and magnetic dipole signature by applying the present invention's novel magnetic scalar-based spherical trilateration process: The method locates a magnetic object by calculating (in surveillance system coordinates) the location indicative of the point or points of intersection of the "detection spheres" corresponding the measured $B_I$ fields at a number of nearest-neighbor network nodes where the minimum number is dependent on the dimensional nature of the array of nodes. In accordance with the scalar potential representation for $B_I$ for a given object M and measured magnetic anomaly field $B_I$-field, the radius of the corresponding detection sphere will be: $r_I=[(\mu/4\pi)k_{B,I} M/B_I]^{1/3}$.

(5) Application of least squares fit based processes: This function can be used to compensate for asphericity errors and refine the object localization/tracking results from Step (4) or for the case of multiple objects.

(6) Outputting of object detection, localization, classification and tracking (DLCT) information including presentation in human-discernible formats (e.g., audio, visual, etc.) and/or computer-discernible formats.

Figure 3:
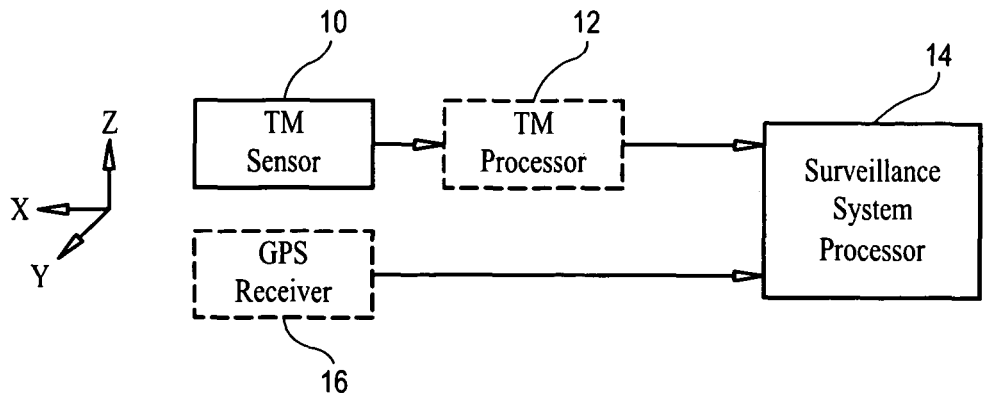
FIG. 3 is a schematic view of the basic elements of a proximity sensor node and processing elements associated therewith in accordance with an embodiment of the present invention.

Referring again to the drawings, FIG. 3 illustrates the basic elements of a magnetic proximity sensor node for an embodiment of the present invention where the optional elements are presented in dashed-line boxes. A TM sensor 10 includes an orthogonal array of three magnetic field sensing elements that measure XYZ components of vector total field $B_{TI}=B_I+B_{EI}$ in the TM frame of reference. TM sensor 10 can include a digitizer (not shown) to convert analog B-field data to digital words. Analog TM data could also be sent to a separate TM processor 12 as shown, or the analog data could be directly sent to a Surveillance System Processor (SSP) 14 for the analog-to-digital conversion and further processing to discriminate $B_I$ fields, their magnitudes $B_I$, and develop object localization data. For applications that require rapid surveillance system deployment, a TM/node optionally could include a GPS antenna/receiver 16 (co-located with TM sensor 10) that would rapidly provide SSP 14 with the TM's position relative to other TM sensors in the surveillance system and enable synchronization and time-stamping of multi-node/multi-channel data.

Figure 4:
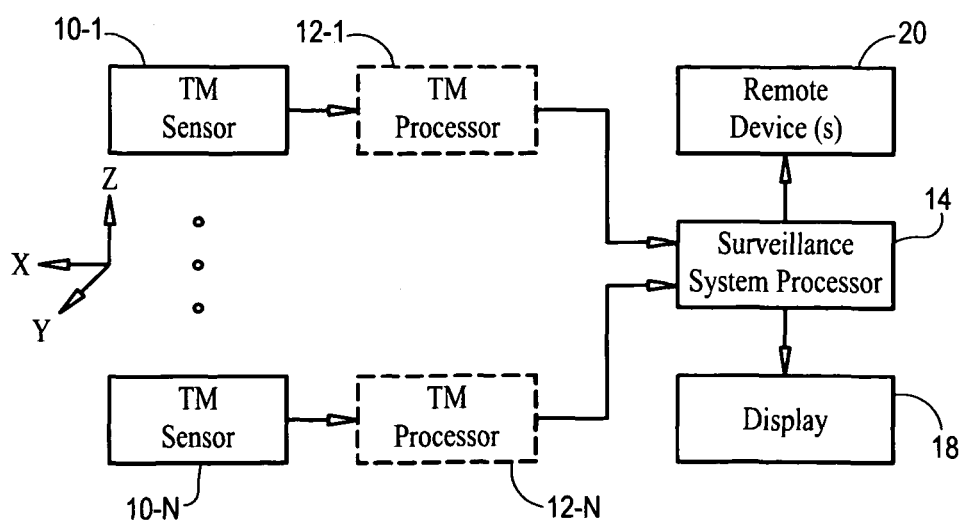
FIG. 4 is a schematic view of a surveillance system for tracking a moving magnetic object in accordance with an embodiment of the present invention.

The schematic in FIG. 4 is a block diagram of a magnetic surveillance system in accordance with a single-TM-per-node embodiment of the present invention. The schematic shows the basic units of a magnetic surveillance system comprised by a network of sensor nodes with corresponding processing elements and input/output (I/O) devices. Here, a network of "N" nodes is comprised by magnetic TM sensors 10-1 through 10-N that are spaced apart at known locations (e.g., using standard surveying equipment, distance measuring devices, a locally referenced differential GPS co-located at each sensor/node). The network of sensors/nodes can be arranged in one, two, or three dimensional arrays without departing from the scope of the present invention. For example, a one-dimensional array can use as few as two sensors/nodes and could define a confined entrance to a venue (e.g., a building, a secure area such as the terminal of an airport, etc.). A two-dimensional array could be used to define a confined pathway/walkway through which "objects" must pass. A three-dimensional array could be used for surveillance of three-dimensional spatial regions (e.g., in water, air, a building, etc.) where object movement is not constrained to one or two dimensions.

Regardless of the array's dimension, the TM sensors must be accurately positioned and oriented (preferably with respective ones of the TMs' field-sensing axes mutually in parallel) in a region wherein moving magnetic objects are to be detected, localized, classified, and tracked. A network XYZ coordinate system is defined as shown. Each I-th TM sensor measures the XYZ components of a total magnetic vector field ($B_{TI}$) that is the vector sum of a background field ($B_E$) that includes the Earth's field plus any static anomaly fields due to nearby ferrous objects and any anomaly field(s) ($B_I$) due to objects that are moving in the surveillance area. Thus, each I-th TM measures $B_{TI}=B_{EI}B_I$ at its location.

Each TM sensor 10-1 through 10-N processes its measured data using an onboard processor (not shown), locally at a corresponding TM processor 12-1 through 12-N, or via direct passage of its data to the system's SSP 14. The process(es) performed by SSP 14 include:
i) determining the total magnetic anomaly field scalars $B_I$ that correspond to each I-th point of the array;
ii) calculating differential field components (and/or gradient tensor components) between TM sensors;
iii) determining object location and magnetic dipole signature using the invention's novel magnetic spherical trilateration-based object localization scheme; and
iv) outputting object DLCT data to, for example, a surveillance system display 18 as well as any one or more of a number of remote devices 20 such as audio/visual devices (e.g., a video camera controlled by SSP 14) that provide surveillance personnel with indications of the presence, locations, magnetic dipole signatures and trajectories of an object(s) of interest.

In general, spherical trilateration involves the localization of a point(s) in space through determination of the point(s) that are common to intersecting spheres whose centers are located at known positions in three-dimensional space. For example, the Global Positioning System (GPS) relates the location of a point in space to the point of intersection of four spheres whose radii correspond to the time/distance for radio waves to travel between accurately located GPS satellites and the given point in space. In accordance with the geometry of spheres, the geometric locus of points common to the intersection of two spheres is a circle, the common intersection of three spheres defines the location of two points, and the common intersection of four spheres will uniquely determine the location of a single point. In this process, the basic equation of a sphere of radius $r_I$ is given by $r_I^2=X^2+Y^2+Z^2$ where the XYZ refer to Cartesian coordinates of points on the surface of the sphere.

The present invention's magnetic surveillance system uses a one, two, or three-dimensional network of TM nodes where each node's measurement sphere relates to the location of a magnetic object. For example, a three-dimensional network of TM nodes would require the object to be simultaneously detected by four TMs in order to precisely locate (and track) the object. The arithmetic of the trilateration process can be simplified somewhat if an embodiment uses a two-dimensional or planar network (or one-dimensional or linear network) of TMs, all at the same height above the ground (for example). In accordance with the scalar equation $B_I=k_{B,I}(\mu/4\pi)Mr_I^{-3}$, for a given object M and measured field $B_I$, the corresponding radius $r_I$ of the magnetic measurement sphere will be $r_I=[k_{B,I}(\mu/4\pi)M/B_I]^{1/3}$. The present invention's magnetic scalar-based spherical trilateration process basically relates the $r_I$ of the TM's magnetic measurement spheres to geometrical spheres with radii $r_I$ whose centers coincide with the TM's locations in the surveillance network. Mathematically, this can be written as $$r_I^2=[k_{B,I}(\mu/4\pi)M/B_I]^{2/3}==X^2+Y^2+Z^2$$

The magnetic scalar-based spherical trilateration process will now be described in mathematical detail with the aid of FIG. 5 where a two-dimensional or planar array of four TMs 10-1 through 10-4 is illustrated. For clarity of illustration, the processing elements associated with the TMs are not shown. An object 200 with magnetic dipole moment M is detected by each of the TMs with the corresponding detection sphere (i.e., a sphere of radius r on which the object 200 could be located as detected by a TM) being referenced by 10-1S through 10-4S. More specifically, for a given object-signature magnitude M that produces a measurable anomaly field $B_I$ at an I-th TM, the radius ($r_I$) of the detection sphere will be $r_I=[(\mu/4\pi)k_{B,I}M/B_I]^{1/3}$. That is, data from each individual I-th node only will locate an object to be somewhere on the surface of a detection sphere (with radius $r_I$) centered on the I-th TM field-sensing unit. In general, the signature M of object 200 will not be accurately known beforehand. Thus, data from a single TM/node cannot be used to accurately locate a magnetic object. However, by combining $B_I$ data from multiple (accurately located) TMs, an object can be localized and tracked. For example, in the example illustrated in FIG. 5, the location of object 200 will be at the intersection of the detection spheres 10-1S, 10-2S, 10-3S and 10-4S. Since the nodal coordinates and internodal distances are accurately known, the basic magnetic anomaly-based scalar equations relating detection sphere radii (e.g., $r_1, r_2, r_3, r_4$) to $B_I$ magnitudes can be used in geometry-based trilateration equations for intersecting spheres to uniquely determine the object location's location in network XYZ coordinates.

Spherical trilateration in the present invention involves application of the basic equation from analytic geometry for a sphere of radius $r_I$ $$r_I=X^2+Y^2+Z^2$$

where X, Y and Z represent Cartesian coordinates of points on the surface of a sphere centered on $X=Y=Z=0$. The equations for spheres whose centers "I" are displaced from the origin of coordinates by distances (in the XYZ directions) of Dx, Dy, Dz are:

$$r_I^2 = (X-Dx)^2 + (Y-Dy)^2 + (Z-Dz)^2$$

Figure 5:
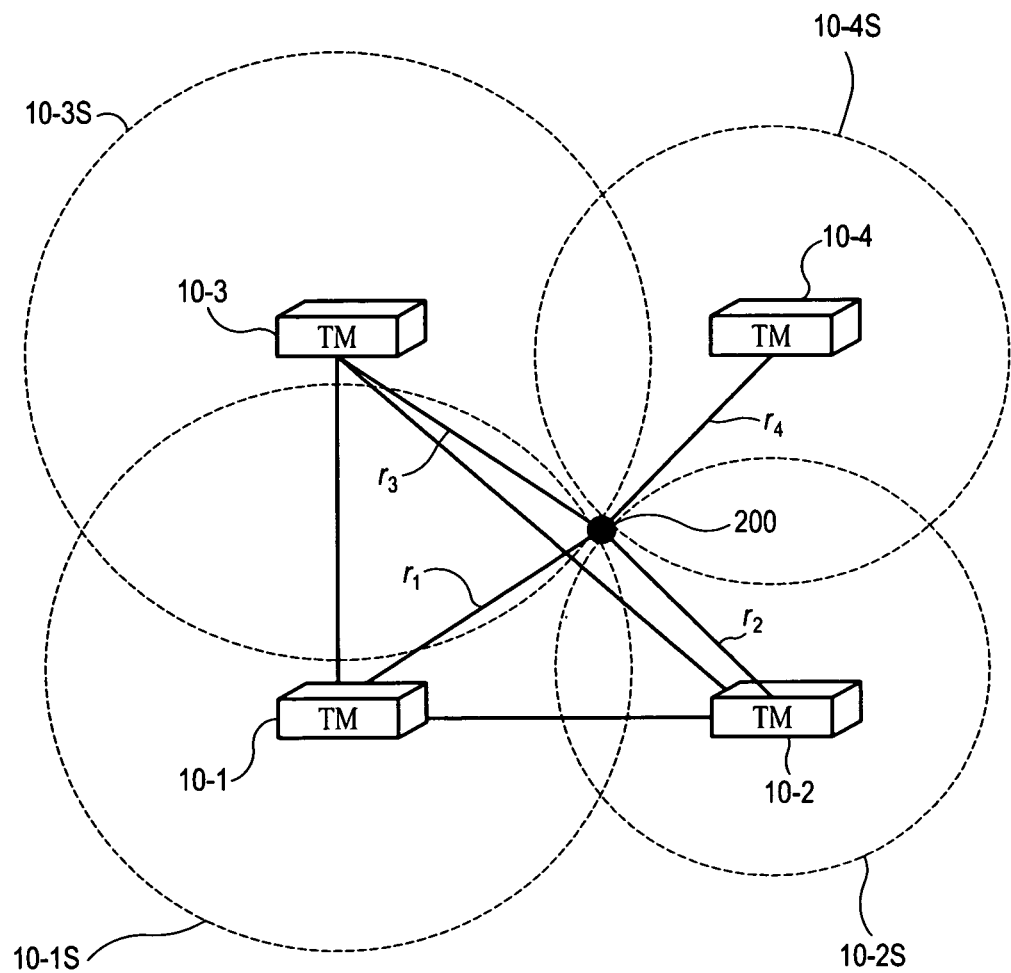
FIG. 5 is a schematic view of the geometry associated with the spherical trilateration process used in the present invention.

Thus, for the planar network configuration shown in FIG. 5, if TM 10-1 is located at X=Y=Z=0, and Z=0 for all TMs (thereby defining a planar array that might be level with the ground), the corresponding geometrical equations for spheres with centers coinciding with the locations of TMs 10-1 through 10-4 are:

$$r_1^2 = X^2 + Y^2 + Z^2$$

$$r_2^2 = (X-Dx)^2 + Y^2 + Z^2$$

$$r_3^2 X^2 (Y-Dy)^2 + Z^2$$

$$r_4^2 = (X-Dx)^2 + (Y-Dy)^2 Z^2$$

With continued reference to FIG. 5, the invention's spherical trilateration process actually relates the XYZ location of object 200 with the intersection of four TM detection spheres located at nodes "I" and with radii determined in accordance with Equation (2); that is:

$$B_I = (\mu/4\pi) k_{B,I} M r_I^{-3} \rightarrow r_I^2 = [(\mu/4\pi) k_{B,I} M / B_I]^{2/3}$$

By taking ratios of $r_I$ and $r_J$, and as a first approximation setting the asphericity parameter $(k_{B,I}/k_{B,J})^{2/3} \approx 1$, a set of simplified ratios for the $r_I$'s in terms of measured $B_I$ and $B_J$ are obtained as follows:

$$r_I^2 / r_J^2 (B_J/B_I)^{2/3} \rightarrow r_I^2 \approx r_J^2 (B_J/B_I)^{2/3}$$

So, for example, $$r_2^2 / r_1^2 (B_1/B_2)^{2/3}$$

$$r_3^2 / r_1^2 (B_1/B_3)^{2/3}$$

$$r_4^2 / r_1^2 (B_1/B_2)^{2/3}$$

and substitution of these magnetically related $r_I$ into the geometric spherical equations results in the following expressions for the detection spheres that intersect at the XYZ location of object 200

$$r_1^2 = X^2 + Y^2 + Z^2$$

$$r_1^2 (B_1/B_2)^{2/3} = (X-Dx)^2 + Y^2 + Z^2$$

$$r_1^2 (B_1/B_3)^{2/3} = X^2 + (Y-Dy)^2 + Z^2$$

$$r_1^2 (B_1/B_4)^{2/3} = (X-Dx)^2 + (Y-Dy)^2 + Z^2$$

These equations can be solved by a variety of methods to yield the XYZ coordinates of object location in the network. (Note that since the asphericity parameter was assumed to be approximately 1 for this explanation, the XYZ coordinates so-determined can serve as a first approximation.) The XYZ values can be appropriately adjusted to correspond to respective $B_I$ XYZ values and substituted into Eq. 1b to determine (a first approximation) for the $M_X$, $M_Y$, $M_Z$ components of the object's magnetic signature. The values of r and M determined by the spherical trilateration process can be further processed/refined using a combination of iterative linear and non-linear least squares fit processes to determine an improved set of r and M components for more accurate localization, classification and tracking of the moving magnetic object as is taught in the afore-cited '083 application.

Figure 6:
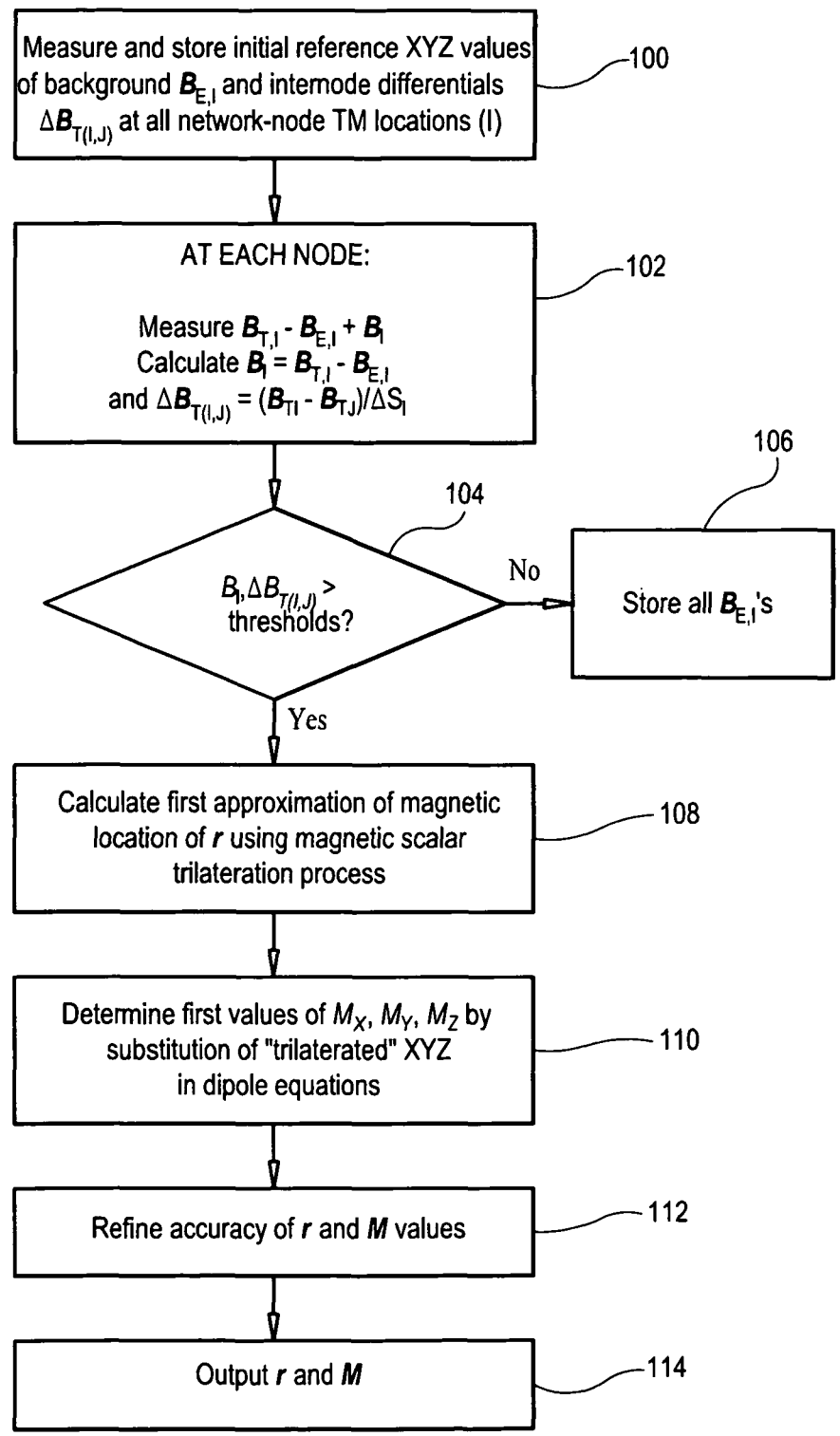
FIG. 6 is a simplified flowchart of the general process steps employed by the system of the present invention.
Figure 7:
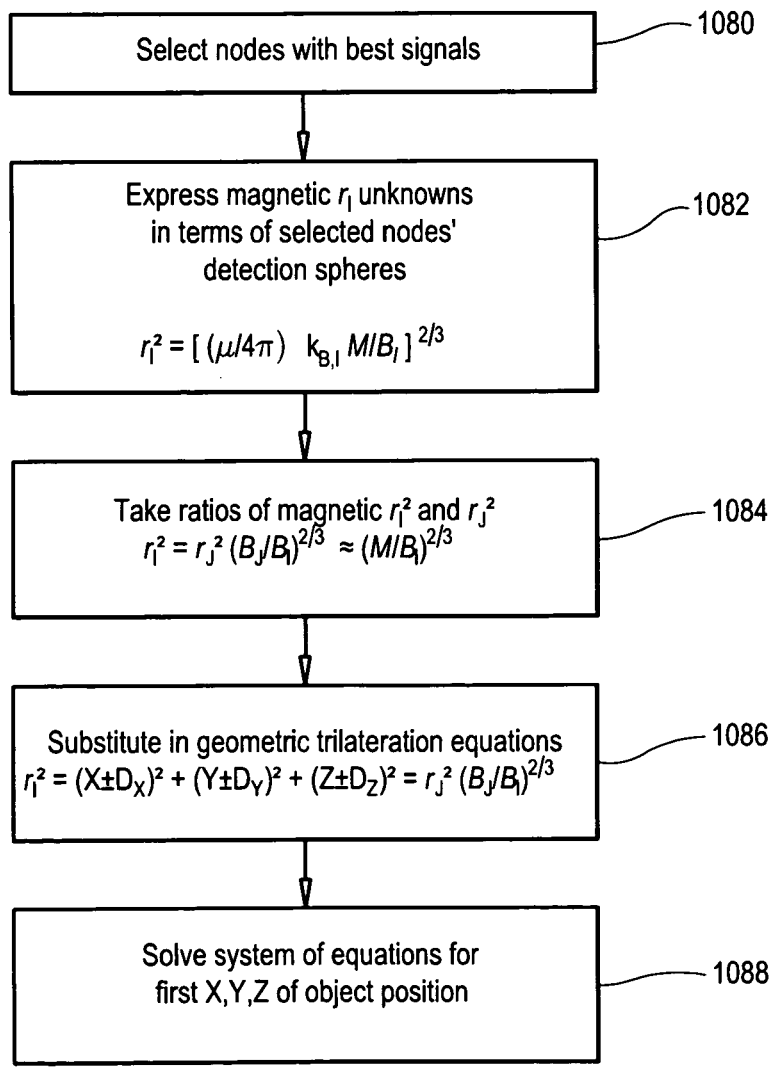
FIG. 7 is a flowchart of the magnetic scalar-based spherical trilateration process used in the present invention.

A typical operational flow of the present invention's magnetic anomaly surveillance system using magnetic scalar-based spherical trilateration (explained in detail above) is summarized in the flowcharts depicted in FIGS. 6 and 7. Referring first to FIG. 6, step 100 involves calibration of the system's nodes to measure/store the background magnetic field and internode differentials for all network nodes. Next, at step 102, each node measures a total magnetic field and the background field measured/stored in step 100 is subtracted therefrom to determine the magnetic field due to any anomalies at each node. Internode differentials can also be determined here to determine if the magnetic anomaly field is due to a geomagnetic or other long range magnetic disturbance not indicative of an object of interest. Comparison step 104 compares the magnetic anomaly scalar magnitudes (and the internode differentials if they are so-determined) with threshold values indicative of an object of interest. If the internode differentials are all zero or approximately zero, this is an indication that the detected magnetic anomaly (that will result in a relatively substantial magnetic scalar magnitude) is due to a geomagnetic disturbance, etc. Accordingly, an object of interest is indicated when both magnetic scalar magnitudes and internode differentials exceed predetermined threshold values. If the thresholds are not met, the current background magnetic fields at each node are stored at step 106 and processing returns to step 102. If the thresholds are satisfied, processing continues to step 108 where a first approximation of the magnetic anomaly's location in surveillance system (XYZ) coordinates is determined using the present invention's magnetic scalar-based spherical trilateration process. At step 110, the object's location determined at step 108 is used with the $B_I$-field data from 1 sensor node(s) in the well known dipole equations (i.e., Equations (1a) and (1b)) to determine first values of the magnetic dipole moment used in object classification. Depending on the requirements of the application, step 112 can be employed to refine accuracy of both the location and the magnetic dipole moment in accordance with the techniques disclosed in the afore-cited '083 application. Finally, step 114 provides for the output of the object's location in network coordinates and its magnetic dipole moment (classification). The output can be presented as time sequenced data to provide object tracking information.

Summarized details of the present invention's magnetic scalar-based spherical trilateration process (step 108) are presented in FIG. 7 where the process begins with step 1080 as nearest-neighbor TM sensor nodes with the best signals are selected for the trilateration process. Typically, the best signals are indicated by the largest magnetic scalar magnitudes. So, for example, in a three-dimensional array of TM sensor nodes, four nearest-neighbor nodes (each of which satisfied the threshold comparison in step 104) having the largest scalar magnitudes are selected. The scalar magnitudes associated with the selected nodes are then processed at step 1082 to express the magnetic location unknowns in terms of the selected nodes' detection spheres. Step 1084 forms ratios using the magnetic unknowns. Step 1086 substitutes these ratios into the geometric trilateration equations. Finally, step 1088 solves these equations to determine the first approximation of the object's X,Y,Z location.

Figure 8:
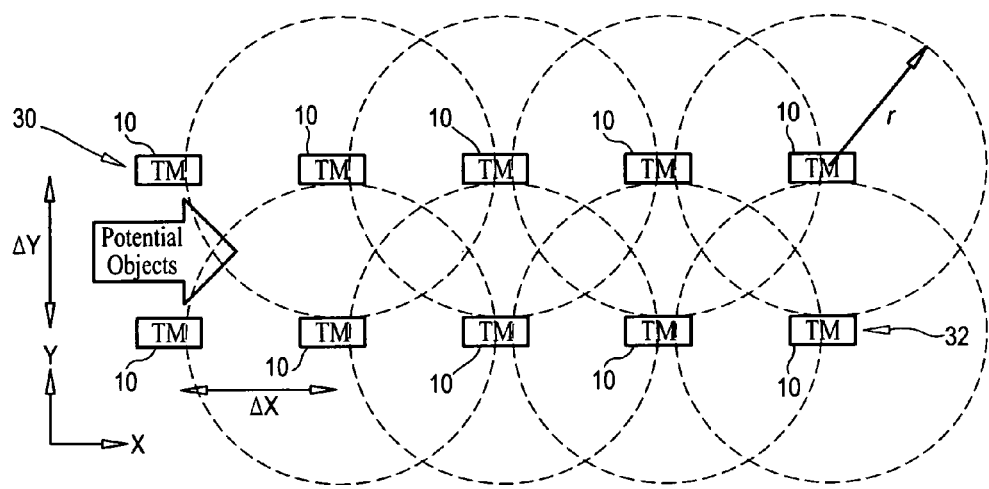
FIG. 8 is a top-view of a two-dimensional planar array of TM sensors used in an exemplary application of the present invention.

Several non-limiting applications of the present invention will now be described with the aid of FIGS. 8-11. FIG. 8 is top view of a two-dimensional, planar arrangement of TM sensors that can be used in the invention's trilateration-based method for localization and tracking of magnetic objects. Additional processing elements, displays, etc., associated with the sensor nodes are not shown for clarity of illustration. This embodiment uses two spaced-apart linear arrays 30 and 32 of single-TM sensors 10 where potential magnetic objects of interest (e.g., pedestrians that may be carrying weapons, etc.) will be constrained to move between the two lines as illustrated. The circles around each TM sensor 10 represent the sensor's detection spheres with radii $r_j = [(\mu/4\pi)k_{B,j}M/B_j]^{1/3}$ In the above example, the separation distance between TM sensors 10 (i.e., ΔX and ΔY) is equal to the radius (r) of the detection sphere for a given object of interest with magnetic signature M. The appropriate separation distances ΔX and ΔY between sensor nodes will depend on: i) the minimum radii of the TM sensors' detection spheres r that correspond to the magnetic signatures M of the objects of interest to be detected/tracked, and ii) the number of objects that the invention will be required to track at any given time. For example, for applications where at any given time only single, isolated objects will be traversing the overlapping detection spheres of nearest-neighbor TMs, the spacing between nodes can be relatively large (e.g., 0.5 times the radius of the TM's detection sphere for the likely object). Then there will be only one object within the overlapping "fields-of-view" of any group of 2, 3, or 4 adjacent nodes and the invention's trilateration process will be accurate. For applications that require the ability to locate/track multiple, closely spaced objects that may be simultaneously traversing the surveillance area, the following means and methods can be used:

1. The network's node spacing can be reduced sufficiently to ensure that any given object will be predominantly sensed by 3 or 4 nearest neighbor nodes,
2. The surveillance system processor can apply gradient-tensor analysis to sharpen the network's fields of view between nodes,
3. A dual-TM-per-node embodiment of the present invention (e.g., as explained in conjunction with FIG. 10 below) can be deployed to more effectively discriminate between objects,
4. Multi-TM embodiments such as those disclosed in the afore-cited '083 application, the '399 patent, or U.S. Pat. No. 7,603,251 can be deployed at each network node for very highly cluttered applications.

Figure 9:
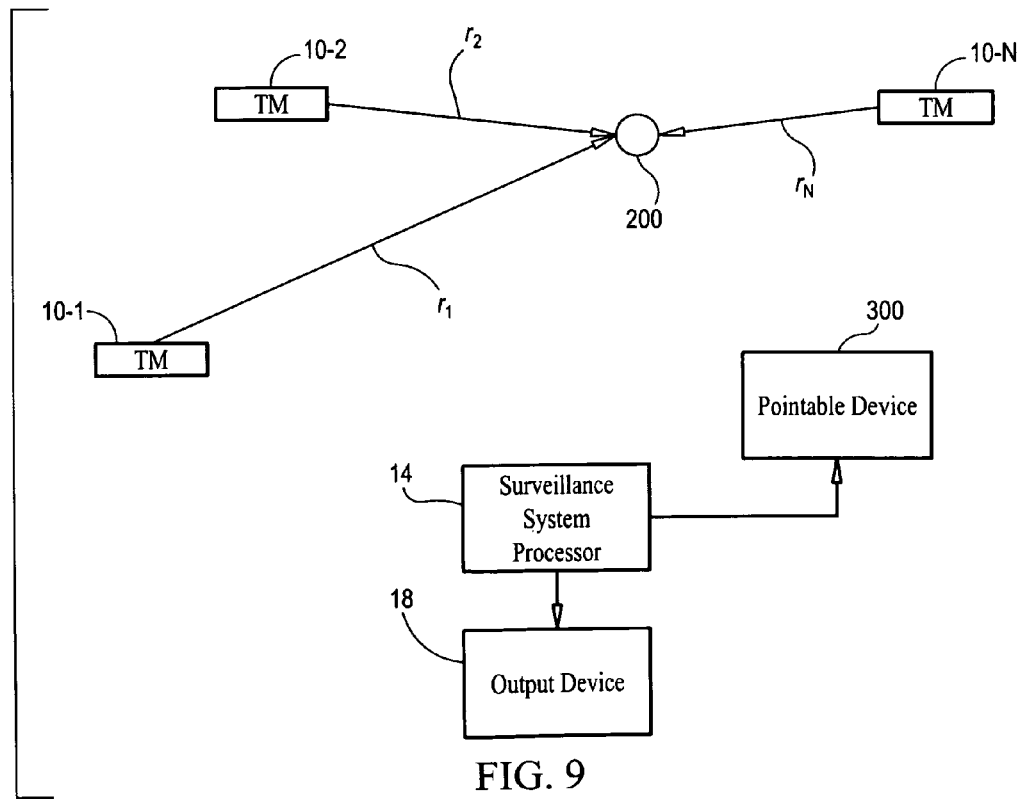
FIG. 9 is a schematic view of a surveillance system embodiment of the present invention used to aim or point a device at a moving object.

Referring now to FIG. 9, a networked magnetic surveillance system is illustrated for tracking, classifying and targeting a moving magnetic object 200 (e.g., a motor vehicle). Here, sensor data from a number of TM sensors 10-1 through 10-N (arranged in a two or three-dimensional array) is used to: i) determine if the object's magnetic signature is that of an object of interest and, ii) remotely manipulate a "pointable" device 300 (e.g., a camera, microwave radar, infrared sensing system, focused sound projector, weapon, etc.) such that device 300 is pointed at object 200. Surveillance system processor (SSP) 14 receives B-field data from TMs at multiple network nodes.

Communication of data from the sensor nodes to SSP 14 can be via, for example, a Wireless Local Area Network or WLAN (not shown). SSP 14 uses the data in the invention's iterative trilateration process to accurately locate, classify and track the object where such information can be provided to an output device 18. For objects of interest, the SSP 14 can activate, control, and point device 300 at the moving object 200. Each TM sensor 10-1 through 10-N can be associated with a GPS receiver (not shown) and/or network-enabling devices that will allow multiplexed data transfers over an appropriate WLAN protocol such as an IEEE 802.1x-compatible format.

Figure 10:
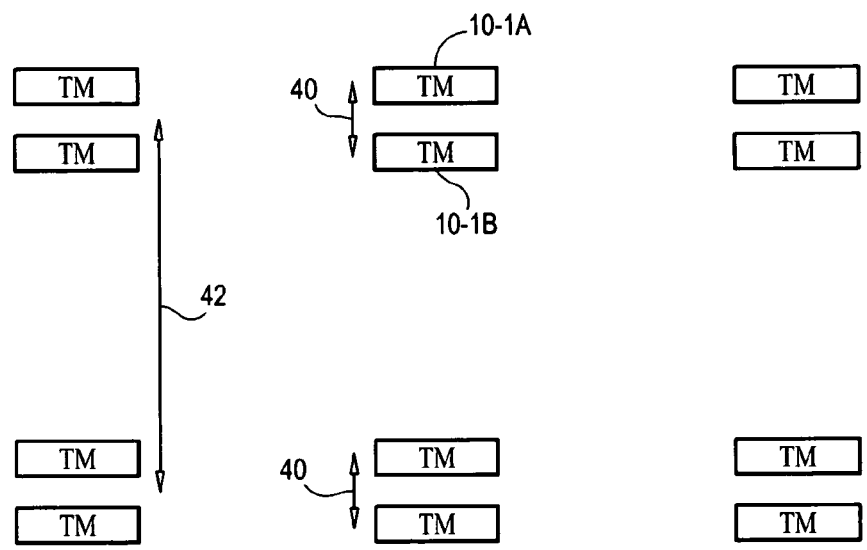
FIG. 10 illustrates a network of dual-TM sensor nodes in accordance with another embodiment of the present invention.

Although previously described embodiments of the present invention have assumed that each "node" of the surveillance system is a single TM sensor, the present invention is not so limited. For example, FIG. 10 illustrates a network of dual-TM sensor nodes for improved object detection, discrimination, localization and tracking of ferrous objects-of-interest in the presence of moderate amounts of moving magnetic clutter. The two TMs at each network node (e.g., TM sensors 10-1A and 10-1B comprise a network node) provide three channels of short range gradient data that are processed simultaneously (using a simplified version of the methods taught in U.S. Pat. No. 7,603,251) with the node's six channels of magnetic anomaly field data. An exemplary intranode gradient distance is indicated by two-headed arrow 40 whereas an exemplary internode gradient distance is indicated by two-headed arrow 42. The gradient data can also be used in a process to reduce seismic noise due to the vibrations of the TM sensors in the earth's background field.

Figure 11:
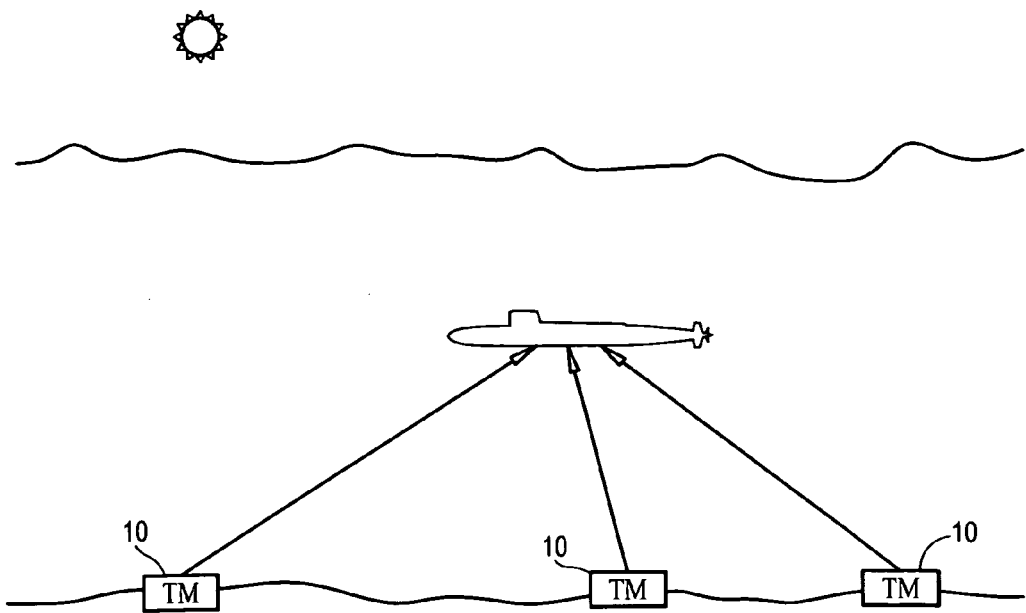
FIG. 11 is a schematic view of a number of TM sensors arranged for underwater surveillance in accordance with another embodiment of the present invention.

FIG. 11 illustrates a three-dimensional array of TM sensors 10 used in an underwater surveillance system. This application uses a network of proximity-sensing TM sensors 10 located on the littoral sea bottom. By applying the invention's magnetic anomaly magnitude-based DLCT methods, a surveillance system using TM sensors 10 can perform real-time tracking and determine range, bearing and elevation of ferrous objects (i.e., underwater and surface vessels) that are moving thru, or on the surface of, the water column. For example, the invention can determine a submarine's tracking parameters (e.g., range, bearing and elevation and/or depth, velocity and magnetic signature, etc.) and output the data via an I/O data link to a system monitor or other user application devices not illustrated in FIG. 11.

The advantages of the present invention are numerous. The magnetic anomaly surveillance system provides point-by-point, unambiguous, real-time DLCT of moving magnetic objects even when the objects' magnetic dipole is continually changing due to its motion. This is made possible by a new and unique magnetic scalar-based spherical trilateration process that relates the intersection of detection spheres from multiple TM sensors to an object's true position. The system can use simple, economical sensor system embodiments that can be cost-effectively distributed over a wide area and still provide more accurate DLCT than prior art technologies. The system is readily adapted to provide standoff capability (using more compact sensor-node distributions) for DLCT of multiple objects.

Although the invention has been described relative to specific embodiments thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A magnetic anomaly surveillance system, comprising:
   a plurality of triaxial magnetometer (TM) sensors with each of said TM sensors having X,Y,Z magnetic sensing axes, said TM sensors arranged in an array with respective ones of said X,Y,Z magnetic sensing axes being mutually parallel to one another in said array, each of said TM sensors at a known location in a coordinate system;
   a processor coupled to each of said TM sensors for generating a scalar magnitude of a magnetic anomaly field measured at each of said TM sensors, wherein each said scalar magnitude is indicative of a spherical radius centered at said known location associated with a corresponding one of said TM sensors,
   generating a comparison between each said scalar magnitude and a threshold value, and
   determining at least one magnetic anomaly location in said coordinate system via a spherical trilateration process that uses each said spherical radius and each said scalar magnitude associated with selected ones of said TM sensors for which said threshold value is exceeded; and at least one output device coupled to said processor for outputting data indicative of said at least one magnetic anomaly location.

2. A magnetic anomaly surveillance system as in claim 1, wherein said processor further determines a magnetic dipole moment at said at least one magnetic anomaly location, and wherein said magnetic dipole moment is included in said data.

3. A magnetic anomaly surveillance system as in claim 1, wherein said array is one-dimensional, and wherein said plurality of TM sensors comprises at least two TM sensors.

4. A magnetic anomaly surveillance system as in claim 1, wherein said array is two-dimensional, and wherein said processor determines said at least one magnetic anomaly location in said coordinate system only when said selected ones of said TM sensors for which said threshold value is exceeded comprises at least three of said TM sensors.

5. A magnetic anomaly surveillance system as in claim 4, wherein highest values of said scalar magnitude are associated with said at least three of said TM sensors.

6. A magnetic anomaly surveillance system as in claim 1, wherein said array is three-dimensional, and wherein said processor determines said at least one magnetic anomaly location in said coordinate system only when said selected ones of said TM sensors for which said threshold value is exceeded comprises at least four of said TM sensors.

7. A magnetic anomaly surveillance system as in claim 6, wherein highest values of said scalar magnitude are associated with said at least four of said TM sensors.

8. A magnetic anomaly surveillance system as in claim 1, wherein said processor further generates a differential quantity for pairs of said TM sensors, each said differential quantity defined by a difference between said scalar magnitude for each of said TM sensors associated with one of said pairs wherein, when each said differential quantity is approximately zero, said processor does not determine said at least one magnetic anomaly location via said spherical trilateration process when said threshold value is exceeded.

9. A magnetic anomaly surveillance system as in claim 1, further comprising a Global Positioning System (GPS) receiver at each said known location and coupled to said processor, each said GPS receiver generating data indicative of said known location associated therewith.

10. A magnetic anomaly surveillance system, comprising:
a plurality of time-synchronized, magnetic field sensing nodes arranged in an array with respective ones of X,Y,Z magnetic sensing axes of each of said nodes being mutually parallel to one another in said array, each of said TM nodes at a known location in a coordinate system with one said known location serving as a reference location in said coordinate system;
a processor coupled to each of said nodes for
generating a scalar magnitude of a magnetic anomaly field measured at each of said nodes, wherein each said scalar magnitude is indicative of a spherical radius centered at said known location associated with a corresponding one of said nodes,
generating a comparison between each said scalar magnitude and a threshold value, and
determining at least one magnetic anomaly location in said coordinate system relative to said reference location via a spherical trilateration process that uses each said spherical radius and each said scalar magnitude associated with selected ones of said nodes for which said threshold value is exceeded,
determining a magnetic dipole moment at said at least one magnetic anomaly location; and
at least one output device coupled to said processor for outputting data indicative of said at least one magnetic anomaly location and said magnetic dipole moment.

11. A magnetic anomaly surveillance system as in claim 10, wherein said array is one-dimensional, and wherein said plurality of nodes comprises at least two nodes.

12. A magnetic anomaly surveillance system as in claim 10, wherein said array is two-dimensional, and wherein said processor determines said at least one magnetic anomaly location in said coordinate system only when said selected ones of said nodes for which said threshold value is exceeded comprises at least three of said nodes.

13. A magnetic anomaly surveillance system as in claim 12, wherein highest values of said scalar magnitude are associated with said at least three of said nodes.

14. A magnetic anomaly surveillance system as in claim 10, wherein said array is three-dimensional, and wherein said processor determines said at least one magnetic anomaly location in said coordinate system only when said selected ones of said nodes for which said threshold value is exceeded comprises at least four of said nodes.

15. A magnetic anomaly surveillance system as in claim 14, wherein highest values of said scalar magnitude are associated with said at least four of said nodes.

16. A magnetic anomaly surveillance system as in claim 10, wherein said processor further generates a differential quantity for pairs of said nodes, each said differential quantity defined by a difference between said scalar magnitude for each of said nodes associated with one of said pairs wherein, when each said differential quantity is approximately zero, said processor does not determine said at least one magnetic anomaly location via said spherical trilateration process when said threshold value is exceeded.

17. A magnetic anomaly surveillance system as in claim 10, further comprising a Global Positioning System (GPS) receiver at each said known location and coupled to said processor.

18. A magnetic anomaly surveillance system, comprising:
a plurality of triaxial magnetometer (TM) sensors with each of said TM sensors having X,Y,Z magnetic sensing axes, said TM sensors arranged in an array with respective ones of said X,Y,Z magnetic sensing axes being mutually parallel to one another in said array, each of said TM sensors at a known location in a coordinate system;
a processor coupled to each of said TM sensors for
generating a scalar magnitude of a magnetic anomaly field measured at each of said TM sensors, wherein each said scalar magnitude is indicative of a spherical radius centered at said known location associated with a corresponding one of said TM sensors,
generating a comparison between each said scalar magnitude and a threshold value,
generating a differential quantity for pairs of said TM sensors, each said differential quantity defined by a difference between said scalar magnitude for each of said TM sensors associated with one of said pairs,
determining at least one magnetic anomaly location in said coordinate system via a spherical trilateration process that uses each said spherical radius and each said scalar magnitude associated with selected ones of said TM sensors for which said threshold value is exceeded, wherein, when each said differential quantity is approximately zero, said processor does not determine said at least one magnetic anomaly location via said spherical trilateration process when said threshold value is exceeded, and determining a magnetic dipole moment at said at least one magnetic anomaly location; and at least one output device coupled to said processor for outputting data indicative of said at least one magnetic anomaly location and said magnetic dipole moment.

19. A magnetic anomaly surveillance system as in claim 18, wherein said array is one-dimensional, and wherein said plurality of TM sensors comprises at least two TM sensors.

20. A magnetic anomaly surveillance system as in claim 18, wherein said array is two-dimensional, and wherein said processor determines said at least one magnetic anomaly location in said coordinate system only when said selected ones of said TM sensors for which said threshold value is exceeded comprises at least three of said TM sensors.

21. A magnetic anomaly surveillance system as in claim 20, wherein highest values of said scalar magnitude are associated with said at least three of said TM sensors.

22. A magnetic anomaly surveillance system as in claim 18, wherein said array is three-dimensional, and wherein said processor determines said at least one magnetic anomaly location in said coordinate system only when said selected ones of said TM sensors for which said threshold value is exceeded comprises at least four of said TM sensors.

23. A magnetic anomaly surveillance system as in claim 22, wherein highest values of said scalar magnitude are associated with said at least four of said TM sensors.

24. A magnetic anomaly surveillance system as in claim 18, further comprising a Global Positioning System (GPS) receiver at each said known location and coupled to said processor, each said GPS receiver generating data indicative of said known location associated therewith.

* * * * *